(12) United States Patent
Zegmout et al.

(10) Patent No.: US 10,972,097 B2
(45) Date of Patent: Apr. 6, 2021

(54) INTEGRATED OPTICAL SWITCH

(71) Applicant: STMicroelectronics SA, Montrouge (FR)

(72) Inventors: Hanae Zegmout, Saint-Vincent-de-Mercuze (FR); Denis Pache, Grenoble (FR); Stephane Le Tual, Saint Egreve (FR); Jean-François Roux, Chambery (FR); Jean-Louis Coutaz, Saint Cassin (FR)

(73) Assignee: STMICROELECTRONICS SA, Montrouge (FR)

( * ) Notice: Subject to any disclaimer, the term of this patent is extended or adjusted under 35 U.S.C. 154(b) by 0 days.

(21) Appl. No.: 16/643,383

(22) PCT Filed: Aug. 29, 2017

(86) PCT No.: PCT/FR2017/052295
§ 371 (c)(1),
(2) Date: Feb. 28, 2020

(87) PCT Pub. No.: WO2019/043301
PCT Pub. Date: Mar. 7, 2019

(65) Prior Publication Data
US 2020/0350910 A1    Nov. 5, 2020

(51) Int. Cl.
*H03K 17/78* (2006.01)
*H01L 31/08* (2006.01)
(Continued)

(52) U.S. Cl.
CPC .......... *H03K 17/78* (2013.01); *H01L 31/028* (2013.01); *H01L 31/035281* (2013.01); *H01L 31/08* (2013.01); *H03M 1/1245* (2013.01)

(58) Field of Classification Search
CPC ....... H03K 17/78; H01L 31/028; H01L 31/08; H01L 31/035281
See application file for complete search history.

(56) References Cited

U.S. PATENT DOCUMENTS 6,873,165 B2 * 3/2005 Lee .................... G01N 21/3581
                                                324/754.23
10,181,544 B2 * 1/2019 Nelson .................. H03K 17/78
(Continued)

OTHER PUBLICATIONS

Gui, Huaimeng, et al., "The Jitter Time of GaAs Photoconductive Switch Triggered by 532- and 10694-nm Laser Pulse," IEEE Photonics Technology Letters, Oct. 1, 2015, vol. 27, No. 19, 4 pages.

(Continued)

*Primary Examiner* — Dinh T Le
(74) *Attorney, Agent, or Firm* — Slater Matsil, LLP

(57) ABSTRACT

In accordance with an embodiment of the present invention, an optical switch includes a photoconductor body including a first edge and an opposite second edge, a first end and an opposite second end. The first edge is configured to receive an electrical input signal and the second edge is configured to deliver an electrical output signal. The photoconductor body is configured to have an electrically ON state that is activated by an optical signal and an electrically OFF state that is activated by an absence of the optical signal. A direction from the first end to the second end defines a longitudinal direction. The direction from the first edge to the second edge defines a first direction that is orthogonal to the longitudinal direction. A first dimension between the first edge and the second edge along the first direction decreases from the first end to the second end.

25 Claims, 3 Drawing Sheets

(51) Int. Cl.
    *H01L 31/028*    (2006.01)
    *H01L 31/0352*   (2006.01)
    *H03M 1/12*      (2006.01)

(56) References Cited

U.S. PATENT DOCUMENTS

2001/0055327 A1   12/2001   Kaneko et al.
2015/0349182 A1   12/2015   Davies

OTHER PUBLICATIONS

Kuppam, Mohan Babu, et al., "Study of Ultrafast Semiconductor Photoswitches for CW RF Signal Sampling and Modulation," Journal of Lightwave Technology, Oct. 15, 2014, vol. 32, No. 20, 8 pages.
Pham, Thach, et al., "Enhanced Responsivity up to 2.85 A/W of Si-based Ge0.9Sn0.1 Photoconductors by Integration of Interdigitated Electrodes", Optical Society of America, 2015, 2 pages.
Tripon, C., et al., "High Dynamic range single channel sampling of wideband RF signals using ultra-fast nanoscale photoconductive switching," Electronics Letters, Feb. 4, 2016, vol. 52, No. 3, 2 pages.

* cited by examiner

INTEGRATED OPTICAL SWITCH

CROSS-REFERENCE TO RELATED APPLICATIONS

This application is a National Stage of International Application No. PCT/FR2017/052295, filed Aug. 29, 2017, which is hereby incorporated by reference in their entirety.

TECHNICAL FIELD

Embodiments of the invention relate to switching devices, for example, to integrated optical switch and circuits formed using the integrated optical switch.

BACKGROUND

A sample-and-hold circuit is a device that samples an analog signal and that, periodically, holds the value of the analog signal at a constant level for a determined period.

For this purpose, sample-and-hold circuits may for example include a switch controlled by a periodic pulsed signal and coupled to a capacitive element, and are configured to receive, as input, the analog signal to be sampled, and to deliver, as output, the sampled signal.

Conventionally, periodic pulsed signals are generated by electronic clock signal generators.

In this type of signal, it is common to observe a jitter phenomenon, which corresponds to time shifts between the pulses of the generated signal and the theoretical pulses that should be observed considering the theoretical frequency of the clock signal generator. Jitter may in particular be caused by electromagnetic interference and may lead to errors in data transmission.

It is for example possible to observe variations of the order of 50 femtoseconds between certain pulses of a generated signal and a theoretical signal of the same frequency.

One solution to this problem comprises the use of a pulsed optical signal, emitted for example by a laser, transmitted to a photoconductor body, the variation in the resistivity of which is clocked by the optical signal. This may make it possible, depending on the laser used, to decrease the jitter phenomenon by a factor of five.

However, this type of switch exhibits a poor ratio of resistivity of the photoconductor in the off state to resistivity of the photoconductor in the on state, which causes the switch to lose efficiency.

SUMMARY

In accordance with an embodiment of the present invention, an optical switch includes a photoconductor body comprising a first edge and an opposite second edge, a first end and an opposite second end. The first edge is configured to receive an electrical input signal and the second edge is configured to deliver an electrical output signal. The photoconductor body is configured to have an electrically ON state that is activated by an optical signal and an electrically OFF state that is activated by an absence of the optical signal. A direction from the first end to the second end defines a longitudinal direction. The direction from the first edge to the second edge defines a first direction that is orthogonal to the longitudinal direction. A first dimension between the first edge and the second edge along the first direction decreases from the first end to the second end.

In accordance with another embodiment of the present invention, an optical switch includes a photoconductor body comprising a first end that is configured to receive an optical signal, and an opposite second end, a first edge and an opposite second edge. The optical switch further includes an input terminal configured to receive an electrical input signal at the first edge, and an output terminal configured to deliver an electrical output signal at the second edge. A control node is configured to switch the optical switch between an electrically ON state coupling the input terminal to the output terminal and electrically OFF state decoupling the input terminal from the output terminal based on a presence or absence of the optical signal at the first end. A first distance between the first edge and the second edge at the first end is different from a second distance between the first edge and the second edge at the second end.

In accordance with another embodiment of the present invention, an integrated electronic circuit includes an input terminal configured to receive an analog electronic signal, and an output terminal configured to deliver a sampled signal. The integrated electronic circuit further includes an optical switch comprising a photoconductor body that comprises a first series of contacts coupled to the input terminal and a second series of contacts coupled to the output terminal. The switch is configured to have an electrically ON state coupling the first series of contacts to the second series of contact in response to an optical signal. The switch is configured to have an electrically OFF state decoupling the first series of contacts from the second series of contact in response to an absence of the optical signal. The photoconductor body comprises a first end that is configured to receive the optical signal, and an opposite second end. A first distance between one of the first series of contacts to one of the second series of contacts at the first end is different from a second distance between another one of the first series of contacts to another one of the second series of contacts at the second end.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
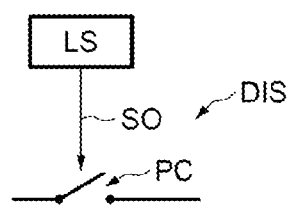
FIG. 1 schematically illustrates an optical switch DIS according to one embodiment.

Embodiments of the invention relate to switching devices, for example but not exclusively those used in analog-to-digital conversion devices, in particular in sample-and-hold circuits.

Thus, according to one embodiment, a switch is provided that may for example be used in sample-and-hold circuits, exhibiting limited jitter effects and having a high ratio of resistivity in the off state to resistivity in the on state.

According to one aspect, an integrated optical switch produced in and on a semiconductor substrate is provided, including a photoconductor body comprising a first end configured to receive an electrical input signal and a second end configured to deliver an electrical output signal, the photoconductor body having an electrically on state that is activated by the presence of an optical signal and an electrically off state that is activated by the absence of the optical signal, wherein the direction from the first end to the second end defines a longitudinal direction.

The photoconductor body has a cross section orthogonal to the longitudinal direction that decreases gradually along the longitudinal direction from the first end to the second end.

The inventors have observed that the decrease in resistivity of the photoconductor body depends in particular on the number of photons absorbed. Furthermore, since the number of photons absorbed decreases along the photoconductor body, a photoconductor body of constant section illuminated by an optical signal exhibits a resistivity that is not uniform, and more specifically one that increases between the first and second end.

Thus, gradually decreasing the section of the photoconductor body makes it possible to compensate for this increase, and hence to decrease the resistance of the photoconductor body in the on state. The ratio of the resistivity of the photoconductor body in the on state to its resistivity in the off state is therefore improved.

According to one embodiment, the cross section has a first dimension taken along a first direction, for example its width, and a second dimension taken along a second direction that is orthogonal to the first direction, for example its height, and the first dimension of the cross section of the photoconductor body decreases gradually, the second dimension remaining constant.

Stated otherwise, it is possible to vary only the width of the photoconductor body, its height remaining constant.

As mentioned above, the first dimension may be the width of the cross section, measured parallel to an upper face of the substrate, and the second dimension may be the height of the cross section, measured perpendicular to the upper face of the substrate.

The first dimension of the photoconductor body may decrease stepwise along an envelope decreasing linearly with distance with respect to the first end in the longitudinal direction.

Decreasing stepwise advantageously makes it possible to produce the device using conventional CMOS fabrication processes.

The first dimension of the photoconductor body may decrease stepwise along an envelope decreasing exponentially with distance with respect to the first end in the longitudinal direction.

The inventors have also observed that the number of photons absorbed along the photoconductor decreases exponentially. A photoconductor body, the width of which decreases exponentially, makes it possible to adapt the shape of the photoconductor body to the number of photons absorbed at a given site on the photoconductor body, and hence to improve the uniformity of resistivity in the on state along the photoconductor body. The ratio of resistivity in the on state to resistivity in the off state is thus further improved.

According to one embodiment, the first dimension of the envelope of the photoconductor body decreases exponentially with the product of the absorption coefficient of the photoconductor body and the distance with respect to the first end in the longitudinal direction.

The absorption coefficient of a material is the ratio of the number of photons absorbed by this material when it is illuminated to the number of photons that are not absorbed, or incident photons. This ratio varies from one material to the next.

Thus, the shape of the photoconductor body is further adapted to the photon absorption rate, which depends on the absorption coefficient of the material of the photoconductor body.

The photoconductor body may include a plurality of juxtaposed portions that are arranged along the longitudinal direction between the first end and the second end, the portions being configured such that the first dimensions of their respective cross section measured in the first direction decrease with said steps.

The optical signal may be delivered at the first end and is intended to propagate along the longitudinal direction.

According to one embodiment, the substrate is a silicon-on-insulator substrate that includes a semiconductor film produced on a buried insulating layer, itself produced on a carrier substrate, and the first direction is parallel to the buried insulating layer and the second direction is orthogonal to the buried insulating layer, and the photoconductor body is produced in the semiconductor film.

According to another aspect, an integrated electronic circuit is provided, including at least one optical switch such as is described above.

The integrated electronic circuit may be a sample-and-hold circuit.

Other advantages and features of the invention will become apparent upon examining the detailed description of completely nonlimiting embodiments of the invention and the appended drawings, in which:

FIGS. 1 to 6 illustrate embodiments of the invention.

FIG. 1 schematically illustrates an optical switch DIS according to one embodiment.

The optical switch DIS is coupled to a pulsed optical signal SO generator LS, for example here a laser, that is configured to deliver the pulsed optical signal SO to the switch DIS, including here a photoconductor body PC.

The pulsed optical signal SO may take here two values, including a first value, for example a nonzero value corresponding to the generation of a light pulse, here a light pulse having a wavelength of 1550 nm, and a second value, for example a zero value corresponding to the absence of a light pulse.

The device presented here is compatible with a range of wavelengths of the optical signal ranging from 1200 nm to 1600 nm, this range of values being dependent on the material used to produce the photoconductor body PC.

The switch DIS is configured to be either in an electrically on state, activated by the presence of a light pulse, or in an electrically off state, activated by the absence of a light pulse.

Stated otherwise, the switch DIS is configured to switch in time with the pulses of the pulsed optical signal SO.

Figure 2:
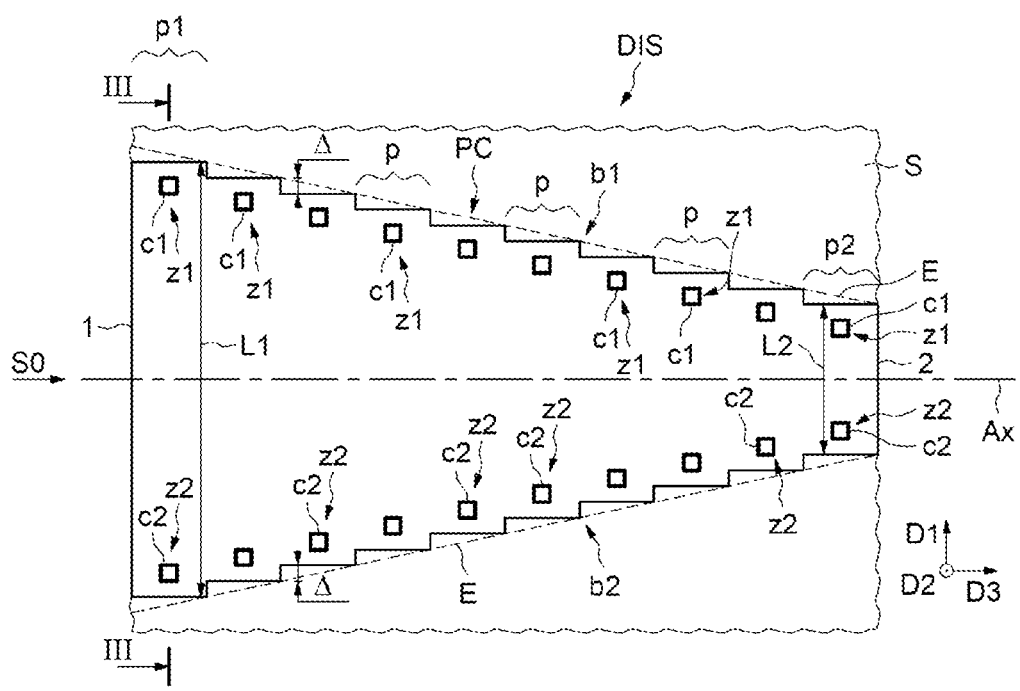
FIG. 2 illustrates a photoconductor body PC is produced in a semiconductor substrate in accordance with an embodiment.
Figure 3:
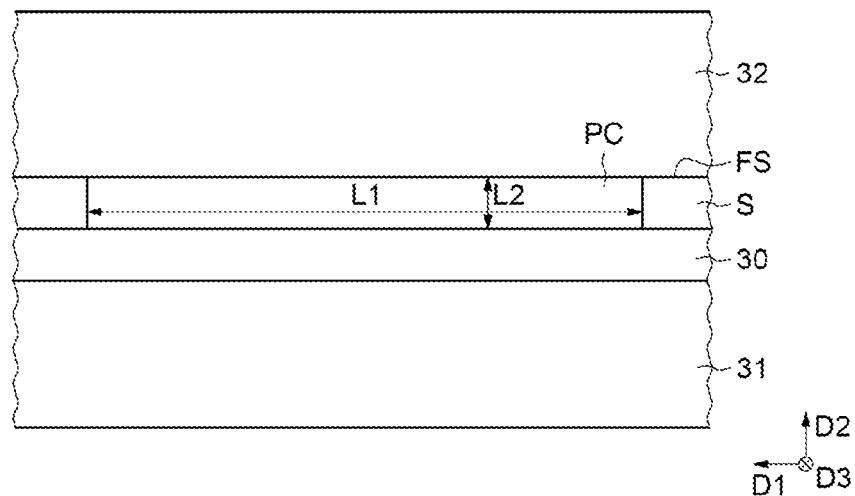
FIG. 3 is a cross section of FIG. 2 along the sectional line III-III.

As illustrated in FIG. 2 and FIG. 3, which is a cross section of FIG. 2 along the sectional line III-III, the photoconductor body PC is produced in a semiconductor substrate S, for example here silicon, and comprises a photoconductor material, for example here germanium.

It would also be possible for the photoconductor body to be produced using another material, for example silicon. In this case, the wavelength of the optical signal SO should be comprised between 600 nm and 1000 nm.

For example here, the switch DIS is produced within an integrated photonic circuit, and the semiconductor substrate S is a semiconductor film produced on top of a buried insulating layer 30 (BOX, as it is commonly known), for example silicon oxide, which is itself produced on a carrier substrate 31. The semiconductor film S—buried insulating layer 30—carrier substrate 31 assembly forms a silicon-on-insulator (SOI) substrate. The substrate S is conventionally surmounted by an interconnect portion 32 including various metal levels and vias allowing the components of the circuit to be connected.

The cross section of the photoconductor body PC has here a first dimension, or width, taken along a first direction D1, and a second dimension, or height, taken along a second dimension D2 that is orthogonal to the first direction D1. The photoconductor body has a third dimension, or length, taken along a longitudinal direction D3 from a first end 1 of the photoconductor body PC to a second end 2 of the photoconductor body PC.

The length of the photoconductor body PC is here 30 μm, the first end 1 has an initial width L1, for example here 15 μm, and the second end 2 has a final width L2, for example here 4 μm.

Specifically, the cross section of the photoconductor body PC decreases gradually along the longitudinal direction D3, from the first end 1 to the second end 2. In this example, only the width of the cross section of the photoconductor body decreases, the height of the cross section remaining constant. The term "gradually" is understood to mean that the width of the cross section of the photoconductor body decreases along an envelope, the width of which decreases regularly between the first end 1 and the second end 2, as will be seen below.

More specifically, the photoconductor body PC comprises here a plurality of juxtaposed portions p, the width of each of which is constant but smaller than the width of the preceding portion (starting from the end 1). For the sake of clarity of the figures, only certain portions p are referenced.

The photoconductor body PC therefore does not have edges b1 and b2 that are continuous, which advantageously makes it possible to produce the photoconductor body PC using conventional fabrication processes.

Each of the edges b1 and b2 of the photoconductor body PC is therefore step-shaped, and decreases stepwise with a rise Δ of 0.6 μm.

Since the rise Δ between each step and the length of each portion p are constant, the width of the envelope E of the photoconductor body PC decreases linearly.

Thus, each portion p has a difference in width of 1.2 μm to each of its adjoining portions, and all of the portions are centered around an axis of symmetry Ax that is colinear with the longitudinal direction D3.

Each portion p taken individually conventionally has a resistivity that is proportional to its dimensions; the resistivity of the photoconductor body PC therefore decreases with distance from the first end 1 in the longitudinal direction D3.

A first series of electrical contact zones z1 is produced along the first edge b1 of the photoconductor body PC, and a second series of contact zones z2 is produced along the second edge b2 of the photoconductor body.

The electrical contact zones of the series z1 and z2 are produced conventionally by doping and siliciding a portion of the photoconductor body PC and are each configured to receive a first series of contacts c1 and a second series of electrical contacts c2, respectively, for example tungsten pillars coupled to metal tracks of the interconnect portion of the integrated circuit CI.

The first series of electrical contacts c1 forms an input of the switch DIS, and is configured to receive a radiofrequency electrical signal, or electrical input signal. The second series of electrical contacts c2 forms an output of the switch DIS, and is configured to deliver the radiofrequency electrical signal, or electrical output signal.

The pulsed optical signal SO generator LS, which is not shown in FIGS. 2 and 3 for the sake of simplification, is configured to deliver the pulsed optical signal SO at the first end 1, in the longitudinal direction D3.

During a pulse of the pulsed optical signal SO, i.e. when the photoconductor body PC is illuminated, the resistivity of the photoconductor body PC decreases proportionally to the number of photons absorbed. Thus, upon reception of a pulse of the optical signal SO, the photoconductor body transitions to the electrically conductive state and the radiofrequency signal may flow between the first series of contacts c1 and the second series of contacts c2.

Since the number of photons absorbed decreases along the photoconductor body PC, the decrease in resistivity will be maximum at the first portion p1, and minimum at the last portion p2.

As such, since the dimensions of the portions p, here the width, and hence their resistivity, decrease along the photoconductor body PC, the effect on the resistivity of fewer photons being absorbed by a portion p will be partly compensated for by a decrease in its dimensions.

During the reception of a pulse of the optical signal SO, the resistivity along the photoconductor body PC is therefore more uniform than for a photoconductor body having a constant width, and the ratio of the resistivity of the switch DIS in the off state to its resistivity in the on state is also higher, hence the performance of the switch is better.

The linear decrease in the envelope E constitutes an acceptable approximation of the decrease in the absorption of photons. As such, the absorption of photons decreases exponentially with distance in the longitudinal direction D3 with respect to the first end 1, and depends in particular on the absorption coefficient of the material of the photoconductor body PC.

Figure 4:
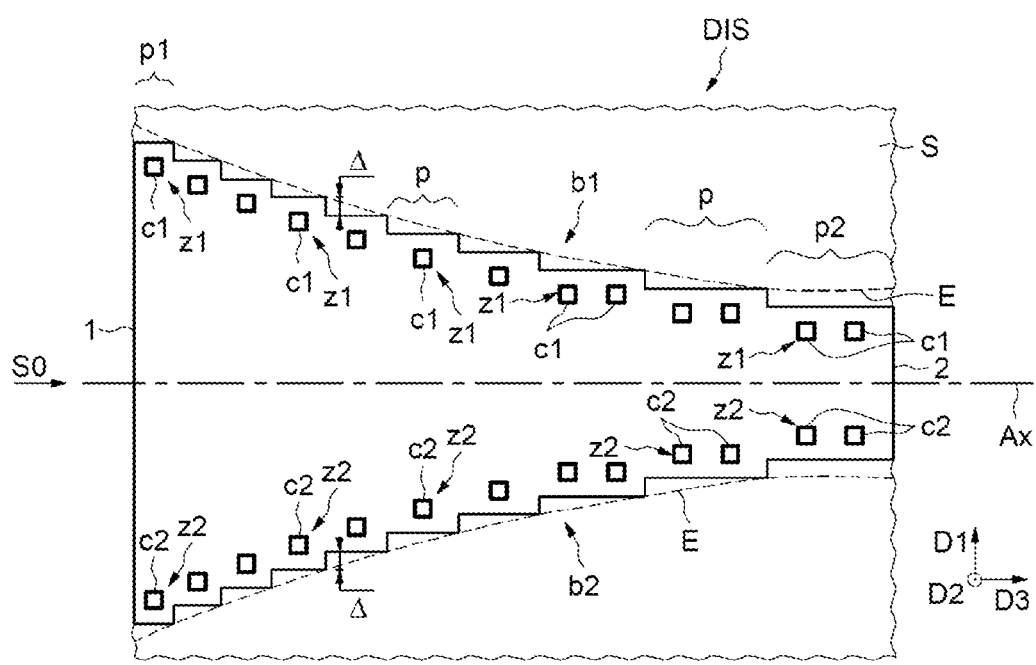
FIG. 4 illustrates an embodiment of the switch including a photoconductor body, where the width decreases stepwise along an envelope.

Thus, as illustrated in FIG. 4, the switch may advantageously comprise a photoconductor body PC, the width of which decreases stepwise along an envelope E, the width of which decreases exponentially according to distance in the longitudinal direction D3 with respect to the first end 1 and according to the absorption coefficient α of the material of the photoconductor body PC, here germanium.

The width of each portion p of the photoconductor body is here defined according to equation (I)

$$L = L1 \cdot e^{-\alpha x} \qquad (I)$$

where L is the width of the portion under consideration, L1 is the width of the cross section at the first end 1, x is the distance of the portion under consideration with respect to the first end 1, and α is the absorption coefficient of the photoconductor body PC.

Depending on the material used, and on the technology for fabricating the integrated circuit CI, there is a minimum threshold of what is achievable by etching for the rise Δ between two successive portions p.

For example here, the minimum threshold for the rise Δ is 0.6 μm.

Thus, it is advantageous to retain a fixed rise Δ between each portion p of the photoconductor body, and to vary the length of each portion p to observe the geometry dictated by equation (I).

The lengths of the portions therefore increase with distance in the second direction D2 with respect to the first end 1.

Thus, since the dimensions of each portion p are particularly suited to the number of photons that it is liable to absorb, the uniformity in the resistance along the photoconductor body PC is even further improved.

Since photoconductor body PC also has a ratio of its resistivity in the off state to its resistivity in the on state that is even higher, the switch DIS is even more efficient.

By way of indication, for an optical source LS delivering an optical signal SO having a wavelength of 1550 nm, and for a photoconductor body PC having a length of 30 μm, this ratio for a switch such as is described in conjunction with FIG. 4 is twice higher than the same ratio for a switch having a cross section of constant dimensions.

Figure 5:
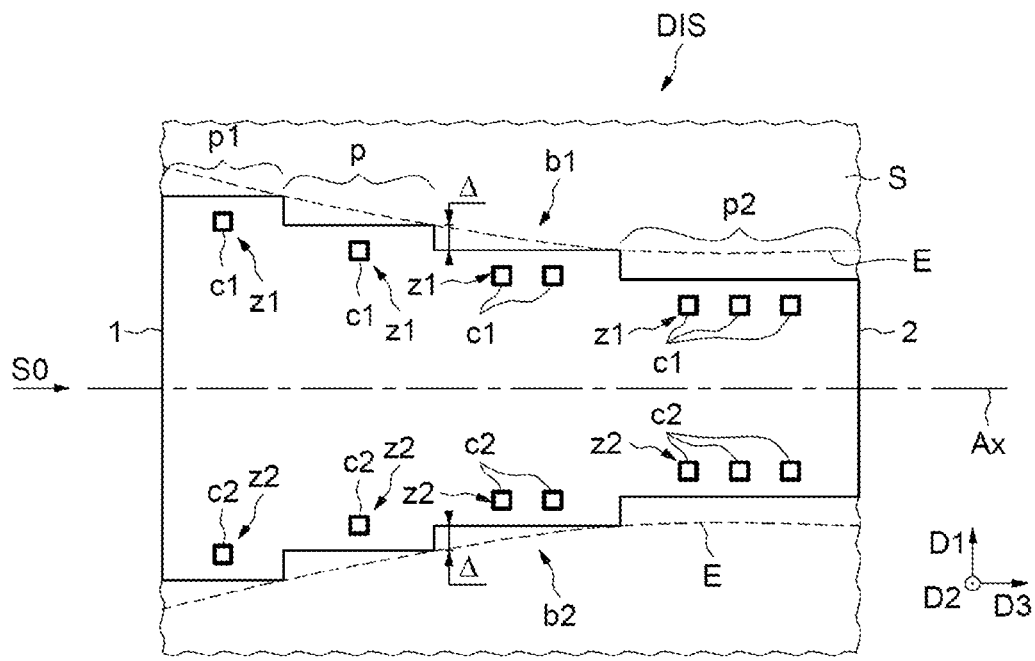
FIG. 5 illustrates a switch having a different number of portions, having different lengths with a different rise that is higher than a minimum threshold.

Depending on the width L1 at the first end 1, on the width L2 at the second end 2, and/or on the length of the photoconductor body PC, it is possible, as illustrated in FIG. 5, to obtain a switch having a different number of portions, having different lengths with a different rise Δ that is higher than the minimum threshold.

Figure 6:
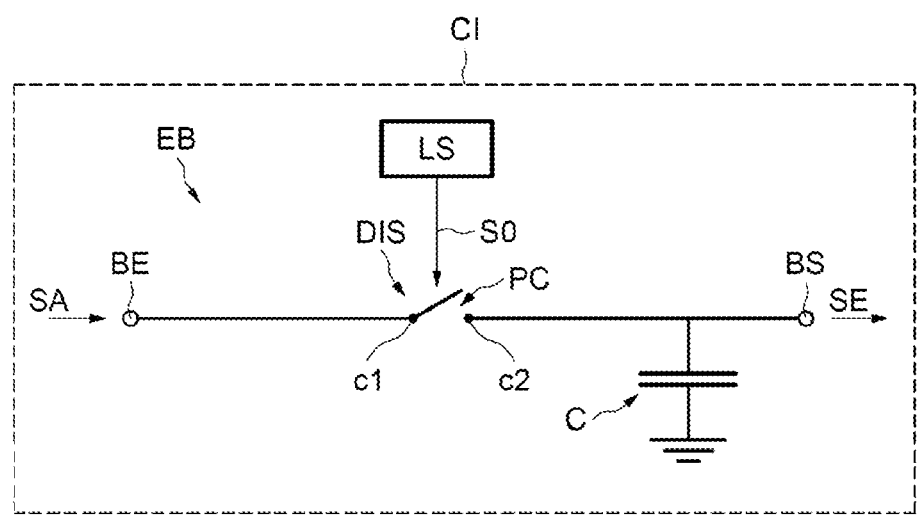
FIG. 6 schematically illustrates, from an electrical standpoint, an integrated electronic circuit CI, including here a sample-and-hold circuit EB including a switch DIS according to one embodiment of the invention.

FIG. 6 schematically illustrates, from an electrical standpoint, an integrated electronic circuit CI, including here a sample-and-hold circuit EB including a switch DIS according to one embodiment of the invention.

The sample-and-hold circuit EB includes an input terminal BE, coupled to the first series of contacts c1 of the switch, and is conventionally configured to receive an analog electronic signal SA, for example a radiofrequency signal, and an output terminal BS coupled to the second series of contacts c2 of the switch DIS, configured to deliver a sampled signal SE.

A capacitor C is coupled between the second series of contacts c2 and ground.

Sampling is therefore here carried out in time with the pulses of the pulsed optical signal LS. The use of the switch DIS makes it possible here to decrease sampling errors due to jitter phenomena and have more efficient switching.

Although a photoconductor body PC produced on a silicon substrate and including germanium has been described above in conjunction with FIGS. 1 to 5, it would be possible to use other photoconductor materials that are compatible with conventional fabrication processes. A person skilled in the art will be able to select suitable materials according to the envisaged applications.

The same applies for the wavelength of the pulsed optical signal SO, which may be chosen so as to have a value other than that presented in conjunction with the embodiments described above.

Furthermore, although a switch DIS comprised in a sample-and-hold circuit EB has been described in conjunction with FIG. 6, the switch DIS is compatible with any type of integrated circuit implementing switching operations.

Although, to vary the cross section of the photoconductor body PC, it is technologically simpler to vary solely the first dimension, for example the width, of this cross section as described above, it would also be possible to envisage varying the second dimension, for example the height, or else varying both the first dimension and the second dimension.

The invention claimed is:

1. An optical switch comprising:
a photoconductor body comprising a first edge and an opposite second edge, a first end and an opposite second end, the first edge configured to receive an electrical input signal and the second edge configured to deliver an electrical output signal, the photoconductor body being configured to have an electrically ON state that is activated by an optical signal and an electrically OFF state that is activated by an absence of the optical signal, wherein a direction from the first end to the second end defines a longitudinal direction, wherein the direction from the first edge to the second edge defines a first direction that is orthogonal to the longitudinal direction, wherein a first dimension between the first edge and the second edge along the first direction decreases from the first end to the second end.

2. The switch as claimed in claim 1, wherein the first dimension between the first edge and the second edge decreases gradually.

3. The switch as claimed in claim 1, wherein the photoconductor body comprises a second dimension along a second direction that is orthogonal to the first direction and the longitudinal direction, and wherein the second dimension remains constant along the longitudinal direction.

4. The switch as claimed in claim 1, wherein the first dimension between the first edge and the second edge decreases stepwise along the longitudinal direction so that the first dimension decreases substantially linearly along the longitudinal direction.

5. The switch as claimed in claim 1, wherein the first dimension between the first edge and the second edge decreases stepwise along the longitudinal direction so that the first dimension decreases substantially exponentially along the longitudinal direction.

6. The switch as claimed in claim 5, wherein the first dimension between the first edge and the second edge decreases exponentially with the product of the absorption coefficient of the photoconductor body and a distance from the first end in the longitudinal direction.

7. The switch as claimed in claim 1, wherein the photoconductor body comprises a plurality of portions that are arranged along the longitudinal direction between the first end and the second end, the portions being configured such that the respective first dimension between the first edge and the second edge decreases from the first end to the second end.

8. The switch as claimed in claim 1, wherein the optical signal is delivered at the first end and the photoconductor body is configured to propagate the optical signal along the longitudinal direction.

9. The switch as claimed in claim 1, further comprising a silicon-on-insulator substrate that includes a semiconductor film disposed on a buried insulating layer, the buried insulating layer being disposed on a carrier substrate, and the semiconductor film comprising the photoconductor body.

10. An integrated electronic circuit comprising:
an input terminal configured to receive an analog electronic signal;
an output terminal configured to deliver a sampled signal; and
an optical switch comprising a photoconductor body that comprises a first series of contacts coupled to the input terminal and a second series of contacts coupled to the output terminal, the switch configured to have an electrically ON state coupling the first series of contacts to the second series of contact in response to an optical signal, the switch configured to have an electrically OFF state decoupling the first series of contacts from the second series of contact in response to an absence of the optical signal, wherein the photoconductor body comprises a first end configured to receive the optical signal, and an opposite second end, wherein a first distance between one of the first series of contacts to one of the second series of contacts at the first end is different from a second distance between another one of the first series of contacts to another one of the second series of contacts at the second end.

11. The circuit as claimed in claim 10, further comprising: a capacitor coupled between the second series of contacts and a reference potential node.

12. The circuit as claimed in claim 10, wherein the integrated electronic circuit is a sample-and-hold circuit.

13. The switch as claimed in claim 10, wherein a distance measured along a first direction between the first series of contacts to the second series of contacts varies substantially linearly along a longitudinal direction from the first end to the second end, the first direction being orthogonal to the longitudinal direction.

14. The switch as claimed in claim 10, wherein a distance measured along a first direction between the first series of contacts to the second series of contacts varies substantially exponentially along a longitudinal direction from the first end to the second end, the first direction being orthogonal to the longitudinal direction.

15. The switch as claimed in claim 10, wherein a distance measured along a first direction between the first series of contacts to the second series of contacts varies in a stepwise manner along a longitudinal direction from the first end to the second end, the first direction being orthogonal to the longitudinal direction.

16. The switch as claimed in claim 15, wherein a step height between adjacent steps in the stepwise manner varies in a direction from the first end to the second end.

17. The switch as claimed in claim 15, wherein a step height between adjacent steps in the stepwise manner decreases in a direction from the first end to the second end.

18. An optical switch comprising:
a photoconductor body comprising a first end configured to receive an optical signal, and an opposite second end, a first edge and an opposite second edge;
an input terminal configured to receive an electrical input signal at the first edge;
an output terminal configured to deliver an electrical output signal at the second edge; and
a control node configured to switch the optical switch between an electrically ON state coupling the input terminal to the output terminal and electrically OFF state decoupling the input terminal from the output terminal based on a presence or absence of the optical signal at the first end, wherein a first distance between the first edge and the second edge at the first end is different from a second distance between the first edge and the second edge at the second end.

19. The switch as claimed in claim 18, wherein the photoconductor body further comprises a first series of contacts at the first edge coupled to the input terminal and a second series of contacts at the second edge coupled to the output terminal.

20. The switch as claimed in claim 18, wherein a distance between the first edge and the second edge varies substantially linearly from the first distance to the second distance.

21. The switch as claimed in claim 18, wherein a distance between the first edge and the second edge varies substantially exponentially from the first distance to the second distance.

22. The switch as claimed in claim 18, wherein a distance between the first edge and the second edge varies in a stepwise manner from the first distance to the second distance.

23. The switch as claimed in claim 22, wherein a step height between adjacent steps in the stepwise manner varies in a direction from the first end to the second end.

24. The switch as claimed in claim 22, wherein a step height between adjacent steps in the stepwise manner decreases in a direction from the first end to the second end.

25. The switch as claimed in claim 18, wherein the first distance is smaller than the second distance.

* * * * *